(12) United States Patent
Luo et al.

(10) Patent No.: US 8,320,193 B2
(45) Date of Patent: Nov. 27, 2012

(54) METHOD OF FLASH MEMORY DESIGN WITH DIFFERENTIAL CELL FOR BETTER ENDURANCE

(75) Inventors: Wenzhe Luo, Shanghai (CN); Paul Ouyang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 190 days.

(21) Appl. No.: 12/794,697

(22) Filed: Jun. 4, 2010

(65) Prior Publication Data
US 2011/0063924 A1      Mar. 17, 2011

(30) Foreign Application Priority Data
Sep. 11, 2009    (CN) .......................... 2009 1 0195638

(51) Int. Cl.
G11C 11/34           (2006.01)
(52) U.S. Cl. ............ 365/185.33; 365/185.18; 365/185.2
(58) Field of Classification Search ............. 365/185.33, 365/185.18, 185.2, 185.21, 210, 189.09, 365/189.07, 189.03, 149, 104, 230.06, 185.23
See application file for complete search history.

(56) References Cited

U.S. PATENT DOCUMENTS

| | | | |
|---|---|---|---|
| 5,714,766 A * | 2/1998 | Chen et al. ....................... 257/17 |
| 5,864,499 A | 1/1999 | Roohparvar et al. | |
| 6,141,256 A * | 10/2000 | Forbes ..................... 365/185.33 |
| 6,256,216 B1 * | 7/2001 | Lien et al. ..................... 365/49.1 |
| 7,269,063 B2 | 9/2007 | Chih | |
| 7,272,062 B2 * | 9/2007 | Taddeo .......................... 365/207 |
| 7,420,844 B2 | 9/2008 | Kato et al. | |
| 7,804,713 B2 | 9/2010 | Parker | |
| 2003/0081447 A1 * | 5/2003 | Hsu et al. ...................... 365/149 |

OTHER PUBLICATIONS

Notice of Allowance for U.S. Appl. No. 12/794,698, mailed on Jun. 26, 2012, 9 pages.

* cited by examiner

*Primary Examiner* — Dang Nguyen
(74) *Attorney, Agent, or Firm* — Kilpatrick Townsend & Stockton LLP

(57) ABSTRACT

A flash memory system includes a first flash memory cell having a first floating gate, a first source region, and a first control gate. The first control gate is connected to a word line. The first flash memory cell includes a first oxide layer separating the first control gate from the first floating gate and a first drain region connecting to a first bit line. The flash memory system also includes a second flash memory cell having a second floating gate, a second source region, and a second control gate. The second control gate is connected to the word line. The second flash memory cell includes a second oxide layer separating the second control gate from the second floating gate and a second drain region connecting to a second bit line. A comparator processes a first and second input signals received from the respective first and second bit lines.

19 Claims, 4 Drawing Sheets

METHOD OF FLASH MEMORY DESIGN WITH DIFFERENTIAL CELL FOR BETTER ENDURANCE

CROSS-REFERENCES TO RELATED APPLICATIONS

This application claims priority to Chinese Patent Application No. 200910195638.4, filed Sep. 11, 2009, entitled "Flash Memory Device and Method Using Differential Cell Design," by Inventors Wenzhe Luo and Paul Ouyang, commonly assigned, incorporated by reference herein for all purposes.

The following commonly-owned co-pending application is being filed concurrently and is hereby incorporated by reference in its entirety for all purposes:

U.S. patent application Ser. No. 12/794,698, in the name of Wenzhe Luo and Paul Ouyang, titled, "Method of Improving Cell Endurance in a Differential Flash Memory Design."

BACKGROUND OF THE INVENTION

The present invention is directed to integrated circuits and their processing for the manufacture of semiconductor devices. More particularly, the invention provides a flash memory device and method using a differential cell design. But it would be recognized that the invention has a much broader range of applicability. For example, the invention can be applied to EEPROMs or other types of memory storage.

A variety of memory devices have been proposed or used in industry. An example of such a memory device is an erasable programmable read-only memory ("EPROM") device. The EPROM device is both readable and erasable, i.e., programmable. In particular, an EPROM is implemented using a floating gate field effect transistor, which has binary states. That is, a binary state is represented by the presence of absence of charge on the floating gate. The charge is generally sufficient to prevent conduction even when a normal high signal is applied to the gate of the EPROM transistor.

Numerous varieties of EPROMs are available. In the traditional and most basic form, EPROMs are programmed electrically and erased by exposure to ultraviolet light. These EPROMs are commonly referred to as ultraviolet erasable programmable read-only memories ("UVEPROM"s). UVEPROMs can be programmed by running a high current between a drain and a source of the UVEPROM transistor while applying a positive potential to the gate. The positive potential on the gate attracts energetic (i.e., hot) electrons from the drain-to-source current, where the electrons jump or inject into the floating gate and become trapped on the floating gate.

Another form of EPROM is the electrically erasable programmable read-only memory ("EEPROM" or "E2 PROM"). EEPROMs are often programmed and erased electrically by way of a phenomenon known as Fowler-Nordheim tunneling. Still another form of EPROM is a "Flash EPROM," which is programmed using hot electrons and erased using the Fowler-Nordheim tunneling phenomenon. Flash EPROMs can be erased in a "flash" or bulk mode in which all cells in an array or a portion of an array can be erased simultaneously using Fowler-Nordheim tunneling, and are commonly called "Flash cells" or "Flash devices."

Various types of Flash cells have been proposed and utilized by the semiconductor industry. As merely an example, a split gate type structure includes a floating gate and a control gate, which has a split type structure. Such split gate structure has been used by companies such as Silicon Storage Technology, Inc. Unfortunately, certain limitations exist with such a split gate type cell structure. For example, such a cell structure may be difficult to shrink beyond a certain critical dimension such as 0.25 micron and below. These and other limitations of the conventional split gate cell have been described throughout the present specification and more particularly below.

From the above, it is seen that an improved technique for processing semiconductor devices is desired.

BRIEF SUMMARY OF THE INVENTION

The present invention is directed to integrated circuits and their processing for the manufacture of semiconductor devices. More particularly, the invention provides a flash memory device and method using a differential cell design. But it would be recognized that the invention has a much broader range of applicability. For example, the invention can be applied to EEPROMs or other types of memory storage.

In a specific embodiment, a flash memory system is provided. The flash memory system includes a first flash memory cell, which includes a first floating gate, a first source region, and a first control gate. The first control gate is connected to a word line. The first flash memory cell further includes a first oxide layer separating the first control gate from the first floating gate. The first flash memory cell also includes a first drain region. The first drain region is connected to a first bit line. The flash memory system also includes a second flash memory cell, which includes a second floating gate, a second source region, and a second control gate. The second control gate is connected to a second word line, with the second word line being the same as the first word line. The second flash memory cell additionally includes a second oxide layer separating the second control gate from the second floating gate. Furthermore, the second flash memory cell includes a second drain region. The second drain region is connected to a second bit line. The flash memory system also includes a comparator connected to the first bit line and the second bit line and configured to receive a first input signal from the first flash memory cell through the first bit line, receive a second input signal from the second flash memory cell through the second bit line, process information associated with the first input signal and the second input signal, and determine a logic state associated with the first flash memory cell and the second flash memory cell based on at least information related to the first input signal and the second input signal.

According to another embodiment of the present invention, a method of reading a logic state from a flash memory system including a first flash memory cell and a second flash memory cell is provided. The method includes applying a word-line voltage to a first control gate of the first flash memory cell and to a second control gate of the second flash memory cell. The method additionally includes applying a first voltage between a first source region and a first drain region of the first flash memory cell. The method also includes applying a second voltage between a second source region and a second drain region of the second flash memory cell. In addition, the method includes receiving a first current from the first flash memory cell in response to the first voltage. Furthermore, the method includes receiving a second current from the second flash memory cell in response to the second voltage. The method also includes processing information associated with the first current and the second current. The method also includes determining a logic state associated with the first flash memory cell and the second flash memory cell based on at least information related to the first current and the second current.

According to another embodiment of the present invention, a method of programming a logic state for a flash memory system including a first flash memory cell and a second flash memory cell is provided. The method includes erasing both the first flash memory cell and the second flash memory cell. In addition, the method includes selecting one flash memory cell from the first flash memory cell and the second flash memory cell. The method also includes applying a word-line voltage to a control gate of the selected flash memory cell. Furthermore, the method includes generating a difference in potential between a source region and a drain region of the selected flash memory cell to program the logic state for the flash memory system. The logic state is associated with both the first flash memory cell and the second flash memory cell. If the selected flash memory cell is the first flash memory cell, the logic state is at a first state. If the selected flash memory cell is the second flash memory cell, the logic state is at a second state.

Many benefits are achieved by way of the present invention over conventional techniques. For example, the present technique provides an easy to use process that relies upon conventional technology. In some embodiments, a differential flash memory design and method of use are described that provide improved endurance in terms of P/E cycles. This can improve the device reliability and performance of the semiconductor circuit being formed by allowing it to function for extended periods of time without failure. A method of altering the read voltage applied within the differential cell design is provided that can be optimized for fast readback or low power savings. Additionally, the method provides a process that is compatible with conventional process technology without substantial modifications to conventional equipment and processes. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

The present invention is directed to integrated circuits and their processing for the manufacture of semiconductor devices. More particularly, the invention provides a flash memory device and method using a differential cell design. But it would be recognized that the invention has a much broader range of applicability. For example, the invention can be applied to EEPROMs or other types of memory storage.

Flash memory has become increasingly used within electronic equipment as a storage medium due to its non-volatility and robustness, among other factors. Flash memory typically stores information in an array of floating gate transistors called "cells", each of which traditionally stores one bit of information. However, one characteristic that is of particular importance in the design and process development of flash memory is its endurance, or how long a flash memory cell can function in normal operation. For example, the endurance of a flash memory cell may be characterized by the maximum Program/Erase (P/E) cycles through which a memory cell state can undergo and still be read out correctly. As flash memory cell content is altered with high-voltage program and erase commands, the tunnel oxide present between the split gates is gradually degraded through the Program/Erase cycles. The result is that the two states of the cell ("Programmed and "Erase") become harder to distinguish as the read window is gradually narrowed.

One common method of improving the endurance of a flash memory cell is to provide better quality oxide through continued process improvement during the initial manufacture of the flash memory device. However, an alternative method of improving the endurance of a flash memory cell would be to modify the design of the flash memory cell and the Program/Erase mechanism used to write and erase data from the cell.

Figure 1:
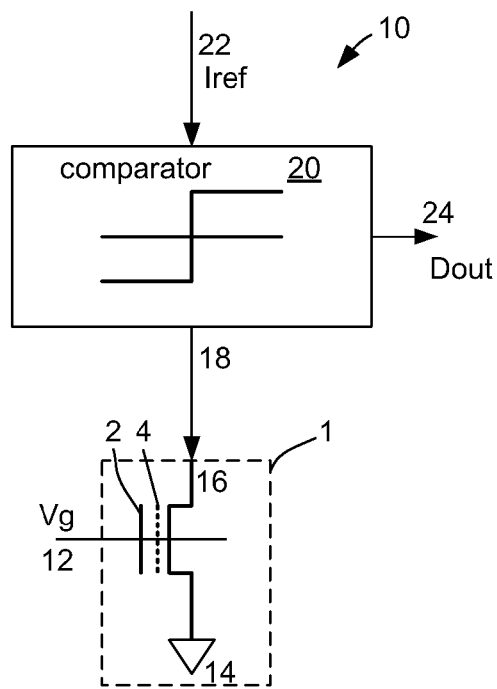
FIG. 1 is a simplified diagram showing the read-out mechanism of a conventional flash memory cell.

Flash memory cells are conventionally designed using a single-cell architecture in, that each bit of data is stored within a single cell. The cell state of the cell which represents that data being stored by the cell is read out as the difference of the word-line voltage and the cell threshold voltage. For example, FIG. 1 is a simplified diagram showing the read-out mechanism of a conventional flash memory cell. Within flash memory system 10, flash memory cell 1 utilizes a split-gate structure in that control gate 2 and floating gate 6 are both utilized. A thin oxide layer 4 separates control gate 2 and floating gate 6 from each other. Source 14 and drain 16 regions are located on sides of the flash memory cell. Gate voltage $V_g$ is input to the flash memory cell through word-line 12. In a conventional method of operation, a positive high voltage is applied to control gate 2 during a Program cycle. This causes electrons to tunnel through the oxide surrounding floating gate 6 and become trapped within thin oxide layer 4. The trapped charges within oxide layer 4 alter the threshold voltage of flash memory cell 1, and the differences within the threshold voltage can be sensed and converted into a binary output. To erase the data stored on memory cell 1 in preparation for reprogramming, a large voltage differential is created between floating gate 6 and control gate 2, and the electrons are removed from oxide layer 4.

Flash memory system 10 further includes comparator 24, which is connected to flash memory cell 2 though bit line 18. Comparator 24 receives a reference level 22 and an output through bit line 18 to output the value being stored within flash memory cell 10 as a digital output 24. The output being received through bit line 18 may be electrical current depending on the threshold voltage $V_t$ of the cell, which is controlled by the number of electrons present in the oxide layer 4 near the floating gate.

However, variations in the threshold voltage may occur across the memory array due to the spatial distribution of cells across the flash memory device. A variation of more than 400 mV in both the programmed state and erased state may occur, even when adjacent cells have very small variations in the threshold voltage $V_t$. As a result, a wider range of voltages may be necessary to further distinguish the voltages used to program a "0" and a "1" within the array of flash memory cells. A word line voltage of about 500 mV above the threshold voltage for an erased cell and about 500 mV below the threshold voltage for a programmed cell is typically required. To properly differentiate between the two states ("1" and "0") the threshold voltage of both states should be separated by at least 1000 mV to clearly recognize the "on" & "off" states. When the voltage window between the erased and programmed cell become less than the minimum window, the sensing circuit will fail.

Figure 2:
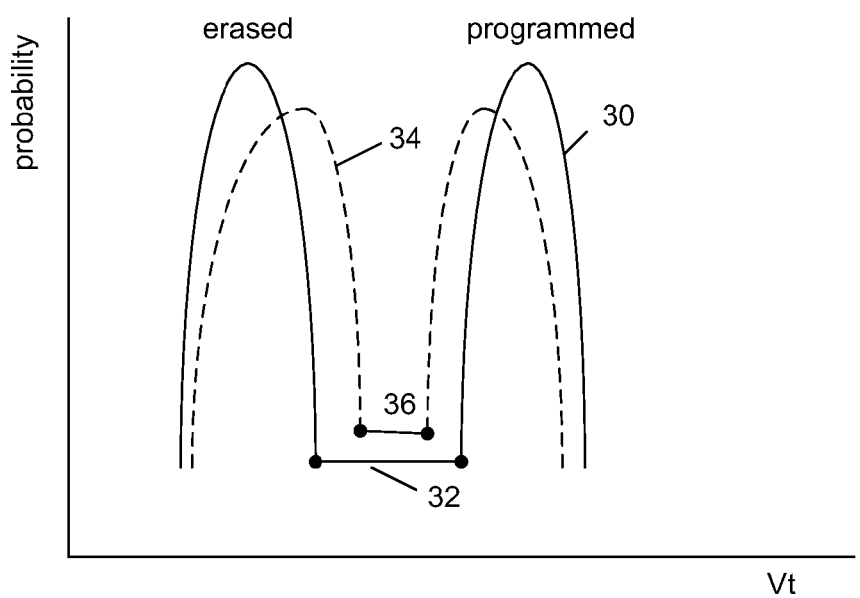
FIG. 2 is an exemplary diagram showing the $V_T$ distribution of cell erased and programmed states for a conventional flash memory cell.

FIG. 2 is an exemplary diagram showing the $V_t$ distribution of cell erased and programmed states for a conventional flash memory cell according to an embodiment of the present invention. These diagrams are merely examples, which should not unduly limit the scope of the claims herein. One of ordinary skill in the art would recognize many variations, alternatives, and modifications. For example, the $V_t$ distribution 30 of an exemplary flash memory cell before cycling is shown in comparison to the $V_t$ distribution 34 for same cell following P/E cycling. The voltage, $V_t$ at which the flash memory cell saturates affects how much current passes through the cell and is an important indicator of the contents of the cell. The read window 32 of $V_t$ distribution 30 prior to cycling gradually diminishes to a smaller read window 36 after a certain number of P/E cycles. In addition, $V_t$ distribution 30 gradually shifts to have a lesser probability of a successful program/erase after P/E cycling, as can be seen in $V_t$ distribution 34. As a result, the $V_t$ distribution and drift toward center after P/E cycling are the two major reasons why read difficulties can occur when flash memory is aged and undergoes a large number of P/E cycles.

Figure 3:
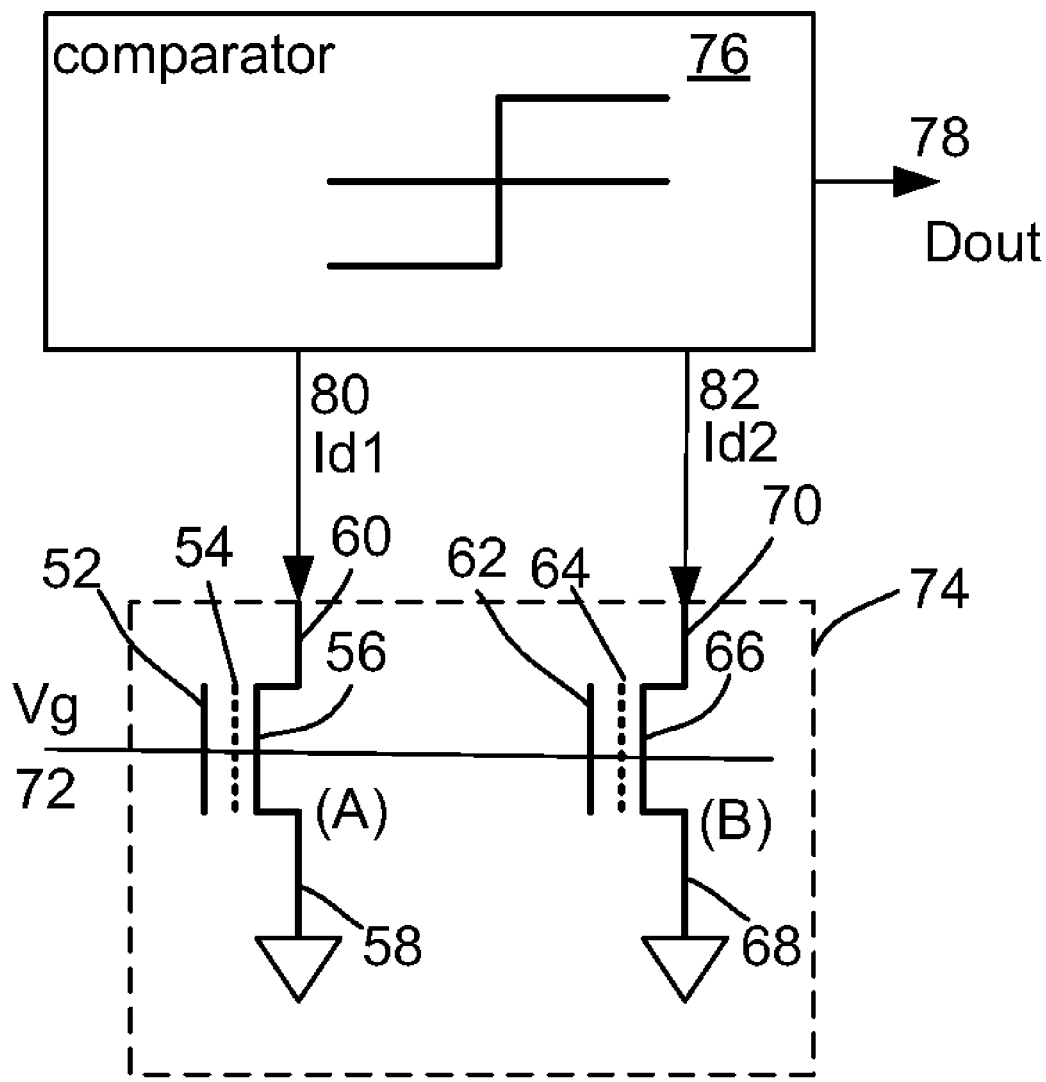
FIG. 3 is a simplified exemplary diagram showing a differential flash memory system according to an embodiment of the present invention.

FIG. 3 is a simplified exemplary diagram showing a differential flash memory system according to an embodiment of the present invention. These diagrams are merely examples, which should not unduly limit the scope of the claims herein. One of ordinary skill in the art would recognize many variations, alternatives, and modifications. Flash memory system 50 includes comparator 76 and flash memory cells (A) and (B), which may be viewed as a single differential memory cell 74. For example, the flash memory cells (A) and (B) may be complementary to each other. In another example, the flash memory cells (A) and (B) may be identical to each other. In yet another example, the flash memory cells (A) and (B) may be complementary, yet distinct from each other. Similar to FIG. 1, cells (A) and (B) utilizes a split-gate structure in that control gates 52, 62 and floating gates 56, 66 are both utilized. A thin oxide layer 54, 64 separates control gate 52, 62 and floating gate 56, 66 from each other. Source 58, 68 and drain 60. 70 regions are located on sides of the flash memory cell. Gate voltage $V_g$ is input to both of the flash memory cells through word-line 72. Flash memory cells (A) and (B) are connected to comparator 76 through bit lines 80, 82. Comparator 76 receives the current from flash memory cells (A) and (B) through bit lines 80, 82 to output the value being stored within flash memory cells (A) and (B) as a digital output 78. While the signal has been described as being transmitted within the current domain, the signal being transmitted through bit lines 80, 82 could be within the voltage domain as well. Of course, there can be other variations, modifications, and alternatives.

Before programming one of the flash memory cells, both of the cells (A) and (B) are erased to an erased state. Depending on which state ("0" or "1") should be stored within the flash memory cells (A) and (B), one of them will be programmed to $V_t$. For example, when a "1" should be stored, only cell (A) is programmed while cell (B) is maintained in an erased state. Conversely, when a "0" should be stored, only cell (B) is programmed while cell (A) is maintained in an erased state. Of course, there can be other variations, modifications, and alternatives.

In addition to a modified flash memory cell design, flash memory system 50 utilizes a different method to read and store data. In the conventional single-cell design as shown in FIG. 1, the different states are recognized by the difference of the reference level and the cell threshold voltage level $V_t$ after programming/erasing. The reference level must be set to allow for the lowest $V_t$ of programmed cell and the highest $V_t$ of the erased cell to be read. In addition, the reference level itself may have an amount of variation inherent within its values. Due to both of these factors, a very conservative margin must be used for proper functioning. As a typical example, the read window which combines the margin for both programmed and erased states should be at least 1000 mV to allow for correct reading of cell contents. In comparison, within the differential cell design, the program and erase states are distinguished by the threshold voltage difference between the two cells only, and any reliance upon an external reference level is removed. Furthermore, the readout circuit (not shown) does not need to account for variations within the $V_t$ distribution of many cells by allowing for a margin. By using comparator 76, a difference of 100 mV can be easily detected which allows for a reduction in the size of the read window to 100 mV level while still allowing flash memory system 50 to read correctly. As a result of the lowered workable read window from 1000 mV to 100 mV, the number of allowable P/E cycles and endurance of the cell is greatly increased. Of course, there can be other variations, modifications, and alternatives.

Figure 4:
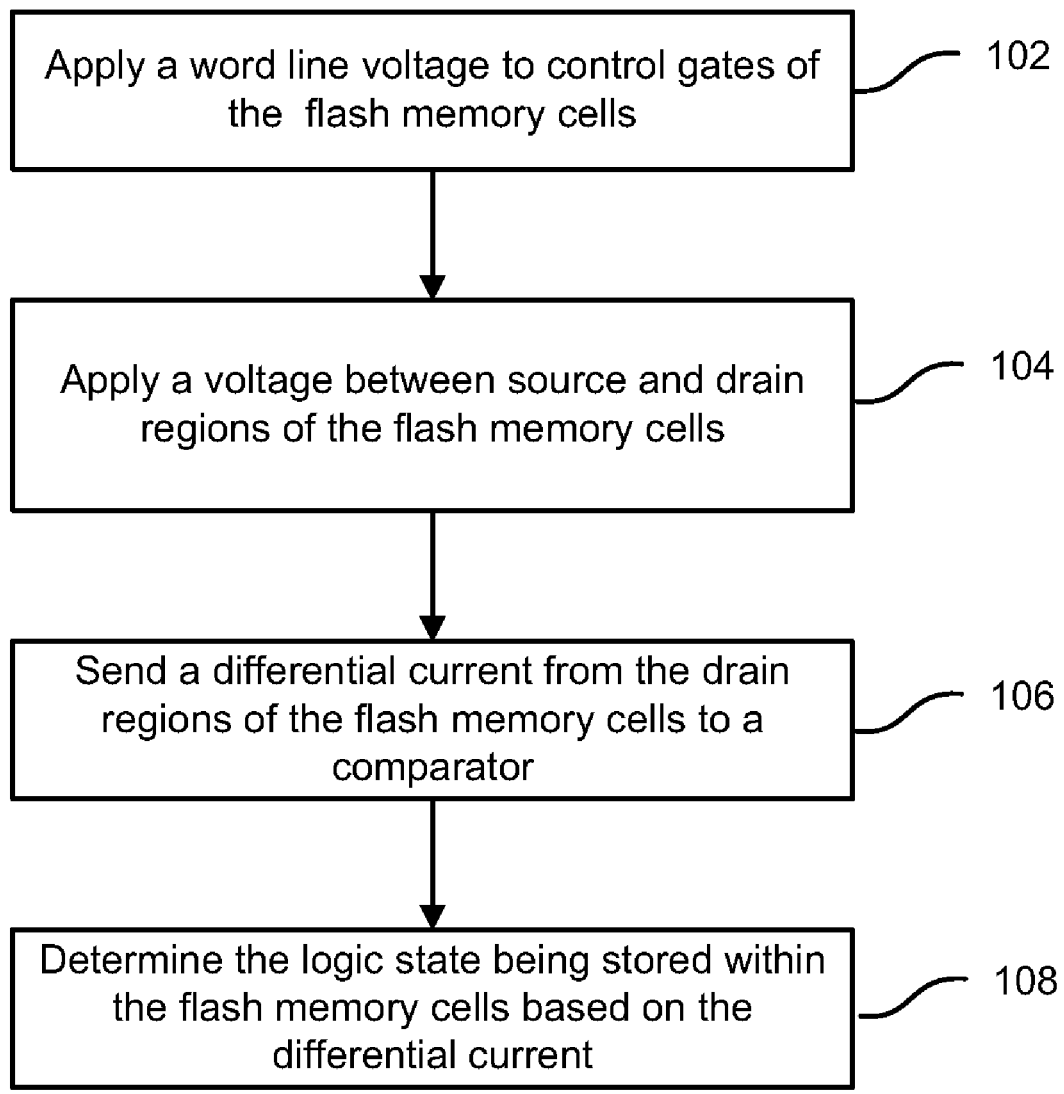
FIG. 4 is a simplified exemplary process flow of a read mechanism used for a differential flash memory system according to an embodiment of the present invention.

FIG. 4 is a simplified exemplary process flow of a read mechanism used for a differential flash memory system according to an embodiment of the present invention. Process flow 100 includes process 102 for applying the word line voltage to control gates of the flash memory cells, process 104 for applying a voltage between source and drain regions of the flash memory cells, process 106 for sending a differential current from the drain regions of the flash memory cells to a comparator, and process 108 for determining the logic state being stored within the flash memory cells based on the differential current. This figure is merely an example which should not unduly limit the scope of the claims. One of ordinary skill in the art would recognize many variations, alternatives, and modifications.

To read the logic state being stored within the differential flash memory cell, a voltage is first applied to the control gates of the flash memory cells in process 102. For example, the voltage applied may be greater than the threshold voltage of an unprogrammed cell, but less than the threshold voltage of a programmed cell. As the flash memory cells are both connected to the same word line 72, the gate voltage being applied may be the same to both of flash memory cells (A) and (B). A second voltage is then applied between the source and drain regions of flash memory cells (A) and (B) in process 104. Depending on whether flash memory cells (A) or (B) have been programmed to a logic state, the amount of current passing across the flash memory cells may change. The second voltage being applied between the source and drain regions of flash memory cells (A) and (B) may or may not be the same between the cells (A) and (B). The resulting currents from both flash memory cells (A) and (B) are sent from the drain regions of the flash memory cells through bit lines 80, 82 to comparator 76. Comparator 76 serves to detect the difference in current between the two cells and determine the logic state being stored within the flash memory cells in process 108. The difference may be detected by first processing information associated with the first current and the second current, and determining a logic state associated with the first flash memory cell and the second flash memory cell based on at least information related to the first current and the second current. For example, the difference in the current can be easily detected as only one of the cells should be programmed at any given time. Of course, there can be other variations, modifications, and alternatives.

Figure 5:
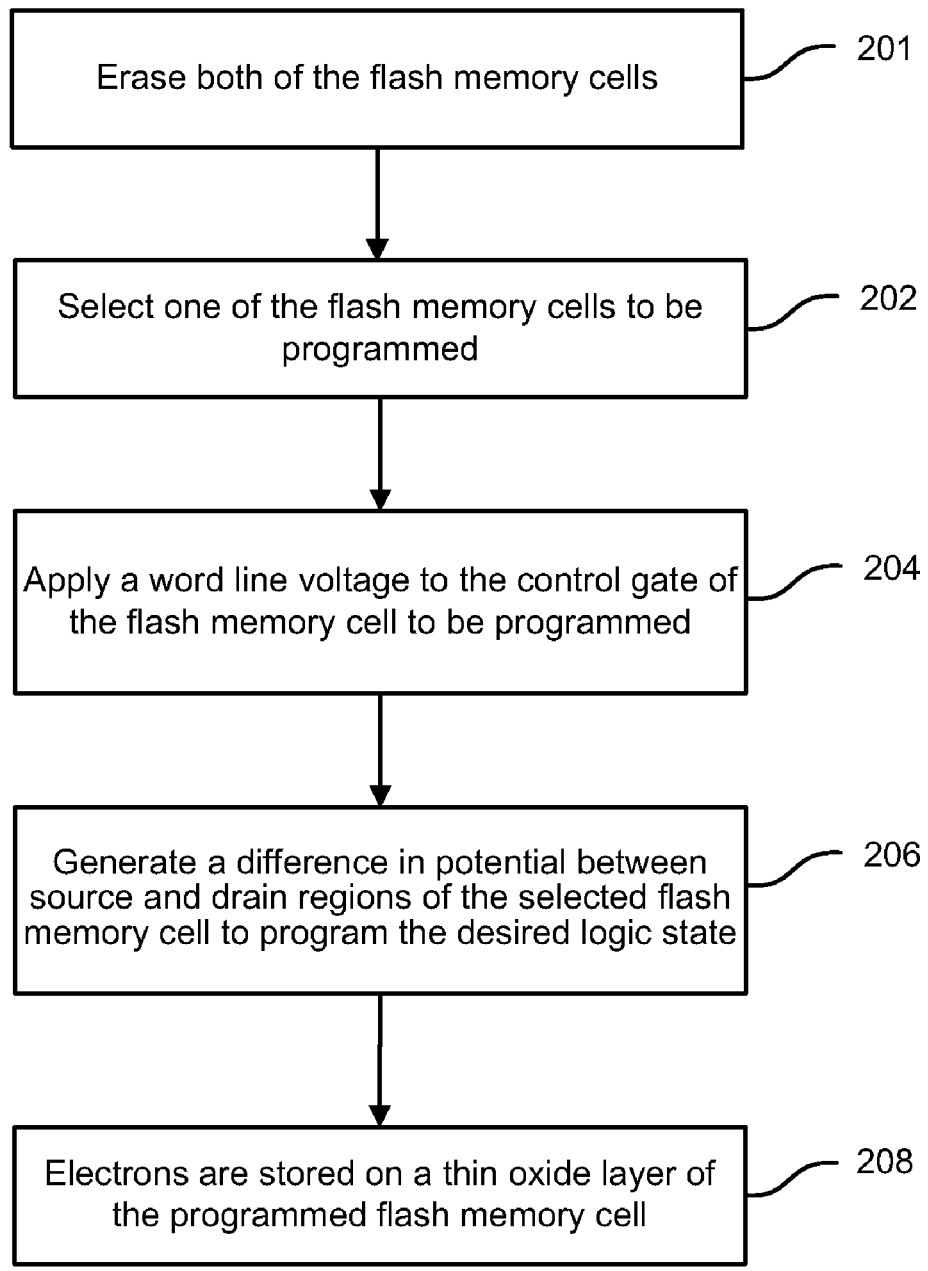
FIG. 5 is a simplified exemplary process flow of a programming mechanism used for differential flash memory system according to an embodiment of the present invention.

FIG. 5 is a simplified exemplary process flow of a programming mechanism used for a differential flash memory system according to an embodiment of the present invention. Process flow 200 includes process 201 for erasing both of the flash memory cells, process 202 for selecting one of the flash memory cells to be programmed, process 204 for applying a word line voltage to the control gate of the flash memory cell to be programmed, process 206 for creating a difference in potential between source and drain regions of the flash memory cell to be programmed, and process 208 for storing electrons on the floating gate of the programmed flash memory cell. This figure is merely an example which should not unduly limit the scope of the claims. One of ordinary skill in the art would recognize many variations, alternatives, and modifications.

In process 201, both of the flash memory cells are erased. This is performed prior to the programming of the cells. In process 202, one of the flash memory cells is selected to be programmed, depending on the logic state desired. The selection of which of the flash memory cells is to be programmed is dependent upon the specific implementation used. In process 204, a word line voltage is applied to the control gate of the cell selected in process 202. A difference in potential is then generated between the source and drain regions of the flash memory cell to be programmed in process 206. If provided with enough energy, the electrons may 'jump' over the oxide region into floating gate to be stored within the thin oxide layer separating the floating gate from the control gate. As a result, the electrons can become stored within the oxide layer between the control gate and the floating gate, resulting in an increase in the threshold voltage of the programmed flash memory cell. The change in the threshold voltage of the cell created by the stored electrons causes the cell to become programmed. For example, a first logic state may be associated with both of the flash memory cells. For example, if the selected flash memory cell is a first flash memory cell which is programmed during this process, the logic state of the flash memory system may be at a first logic state. If the selected memory cell is the second flash memory cell which is programmed during this process, the logic state of the flash memory system may be at a second logic state. In a specific embodiment, the two logic states being represented within the flash memory system may be represented by having one of the cells selected for programming while the other is not programmed. For example, the first logic state may be represented by having the first flash memory cell programmed while the second flash memory cell is left at a lower threshold value, and a second logic state may be represented by having the second flash memory cell programmed while the first flash memory cell is left is left at a lower threshold value. Of course, there can be other variations, modifications, and alternatives.

In another embodiment of the present invention, the read voltage may be optimally selected so that one or more of the flash memory cells (A) and (B) are turned on, but not high enough so that programming of the erased cells would occur. For example, the read voltage can now be set to accommodate two parameters: increased read speed or reduced power consumption. For example, when an increased read speed is required, the read voltage can be increased to make reading from the differential memory cell occur faster. Conversely, when power consumption is a priority but read speed is not as much of a factor, the read voltage can be reduced. Of course, there can be other variations, modifications, and alternatives.

The use of a differential cell structure and related program/read method can serve to greatly alleviate the endurance issue for flash memory devices. By utilizing embodiments of the present invention, the effect of shifting $V_t$ distributions is removed and the read window can be as small as tens of millivolts when performing a read process with the differential flash memory cell. As a result, the lifetime of differential flash memory devices can be greatly increased. An additional benefit is that the word-line voltage can be adjusted depending upon application-sensitive needs, making it possible to optimize for high readout speed or lower power consumption.

It is to be understood that the examples and embodiments described herein are for illustrative purposes only and that various modifications or changes in light thereof will be suggested to persons skilled in the art and are to be included within the spirit and purview of this application and scope of the appended claims.

What is claimed is:
1. A flash memory system comprising:
   a first flash memory cell, the first flash memory cell including:
      a first control gate, the first control gate connected to a first word line;
      a first floating gate;
      a first oxide layer separating the first control gate from the first floating gate;
      a first source region; and
      a first drain region, the first drain region connected to a first bit line;
   a second flash memory cell, the second flash memory cell including:
      a second control gate, the second control gate connected to a second word line, the second word line being the same as the first word line;
      a second floating gate;
      a second oxide layer separating the second control gate from the second floating gate;
      a second source region; and
      a second drain region, the second drain region connected to a second bit line;
   a comparator connected to the first bit line and the second bit line and configured to
      receive a first input signal from the first flash memory cell through the first bit line;
      receive a second input signal from the second flash memory cell through the second bit line;
      process information associated with the first input signal and the second input signal; and
      determine a logic state associated with the first flash memory cell and the second flash memory cell based on at least information related to the first input signal and the second input signal;
   wherein the first and second flash memory cells are erased prior to programming the flash memory system, and
   wherein the logic state is stored within the flash memory system by programming only one of the first and second flash memory cells while the not programmed flash memory cell remains erased.

2. The flash memory system of claim 1 wherein the process information associated with the first input signal and the second input signal comprises compare the first input signal and the second input signal.

3. The flash memory system of claim 2 wherein the determine a logic state associated with the first flash memory cell and the second flash memory cell comprises:
   if the first input signal is higher than the second input signal in magnitude, determine the logic state to be in the first state;
   if the second input signal is higher than the first input signal in magnitude, determine the logic state to be in the second state.

4. The flash memory system of claim 3 wherein each of the first input signal and the second input signal are within the current domain.

5. The flash memory system of claim 3 wherein each of the first input signal and the second input signal are within the voltage domain.

6. The flash memory system of claim 3 wherein the first state is represented by logic "1".

7. The flash memory system of claim 3 wherein the second state is represented by logic "0".

8. The flash memory system of claim 1 wherein the first flash memory cell and the second flash memory cell are complementary.

9. The flash memory system of claim 1 wherein the input signals are dependent upon threshold voltages of the flash memory cells.

10. The flash memory system of claim 9 wherein a difference in threshold voltages between the first and second flash memory cells is less than or equal to 100 mV.

11. The flash memory system of claim 1 wherein the flash memory system has a read window less than or equal to 100 mV.

12. A method of reading a logic state from a flash memory system including a first flash memory cell and a second flash memory cell, the method comprising:
   applying a word-line voltage to a first control gate of the first flash memory cell and to a second control gate of the second flash memory cell;
   applying a first voltage between a first source region and a first drain region of the first flash memory cell;
   applying a second voltage between a second source region and a second drain region of the second flash memory cell;
   receiving a first current from the first flash memory cell in response to the first voltage;
   receiving a second current from the second flash memory cell in response to the second voltage;
   processing information associated with the first current and the second current; and
   determining a logic state associated with the first flash memory cell and the second flash memory cell based on at least information related to the first current and the second current;
   wherein reading the logic state is associated with a read window that is less than or equal to 100 mV.

13. The method of claim 12 wherein the word-line voltage is greater than a threshold voltage of an unprogrammed flash memory cell and less than a threshold voltage of a programmed flash memory cell.

14. The method of claim 12 wherein a difference in threshold voltages between the first and second flash memory cells is equal to or less than 100 mV.

15. The method of claim 12 wherein the word line voltage can be increased to allow for fast readback of the logic state being stored within the first and second flash memory cells.

16. The method of claim 12 wherein the word line voltage can be decreased to allow for increased power savings during the reading a logic state from a flash memory system.

17. The method of claim 12 wherein the first and second flash memory cells are identical to each other.

18. A method of programming a logic state for a flash memory system including a first flash memory cell and a second flash memory cell, the method comprising:
   erasing both the first flash memory cell and the second flash memory cell;
   selecting one flash memory cell from the first flash memory cell and the second flash memory cell;
   applying a word-line voltage to a control gate of the selected flash memory cell; and
   generating a difference in potential between a source region and a drain region of the selected flash memory cell to program the logic state for the flash memory system;
   wherein:
      the logic state is associated with both the first flash memory cell and the second flash memory cell;
      if the selected flash memory cell is the first flash memory cell, the logic state is at a first state;
      if the selected flash memory cell is the second flash memory cell, the logic state is at a second state.

19. The method of claim 18 wherein the first and second flash memory cells are identical to each other.

* * * * *